United States Patent
Jeng et al.

(10) Patent No.: US 6,908,814 B2
(45) Date of Patent: Jun. 21, 2005

(54) PROCESS FOR A FLASH MEMORY WITH HIGH BREAKDOWN RESISTANCE BETWEEN GATE AND CONTACT

(75) Inventors: Pei-Ren Jeng, Hsinchu (TW); Lin-Wu Yang, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/725,556

(22) Filed: Dec. 3, 2003

(65) Prior Publication Data

US 2004/0266105 A1 Dec. 30, 2004

(30) Foreign Application Priority Data

Jun. 30, 2003 (TW) .......................................... 92117768 A

(51) Int. Cl.⁷ ............................................ H01L 21/336
(52) U.S. Cl. ....................................... 438/257; 438/266
(58) Field of Search .................................. 438/257–267

(56) References Cited

U.S. PATENT DOCUMENTS

| | | | | |
|---|---|---|---|---|
| 5,210,047 A | * | 5/1993 | Woo et al. | 438/257 |
| 6,143,611 A | * | 11/2000 | Gilton et al. | 438/279 |
| 6,448,140 B1 | * | 9/2002 | Liaw | 438/279 |
| 6,740,550 B2 | * | 5/2004 | Choi et al. | 438/199 |
| 2003/0181007 A1 | * | 9/2003 | Huang et al. | 438/257 |

* cited by examiner

Primary Examiner—Jack Chen
(74) Attorney, Agent, or Firm—Rabin & Berdo, P.C.

(57) ABSTRACT

A selfaligned process for a flash memory comprises applying a solution with a high etch selectivity to etch the sidewall of the tungsten silicide in the gate structure of the flash memory during a clean process before forming a spacer for the gate structure. This process prevents the gate structure from degradation caused by thermal stress.

7 Claims, 6 Drawing Sheets

PROCESS FOR A FLASH MEMORY WITH HIGH BREAKDOWN RESISTANCE BETWEEN GATE AND CONTACT

FIELD OF THE INVENTION

The present invention relates generally to a semiconductor process, and more particularly to, a selfaligned process for a flash memory.

BACKGROUND OF THE INVENTION

In a complex integrated circuit (IC), the shrinkage of the devices thereof makes the design more difficult. Process such as selfalignment and other techniques are used for the desired designs.

FIG. 1 shows a cross-sectional view of a gate structure 10 in a typical flash memory, in which a tunnel oxide 14 is formed on a substrate 12 with a floating gate polysilicon layer 16 thereon, and an oxide-nitride-oxide (ONO) layer 18 is further formed on the polysilicon layer 16 with a control gate polysilicon layer 20 thereon. Moreover, a control gate tungsten silicide layer 22 and a hard mask layer 24 are formed on the polysilicon layer 20, and a source 30 and a drain 32 are formed on the substrate 12. In the formation of the gate structure 10, deposition and etching processes are used to obtain a gate stack on the substrate 12. Then selfaligned process with the gate stack as a mask is used to form the source 30 and drain 32. After forming the spacers 26 and 28, a selfaligned process is further used to form source and drain contacts. Prior arts are proposed for such selfaligned processes, such as in U.S. Pat. Nos. 5,907,781 and 6,444,530 issued to Chen et al.

However, due to the tungsten silicide layer sandwiched in the gate structure, the critical dimension (CD) will be enlarged and the distances between the gate and the contact windows of the source and drain will be shortened by the thermal expansion of the tungsten silicide layer resulted from the thermal stress when the crystal structure of the tungsten silicide is transferred from tetragon cubic to hexagon cubic in the subsequent thermal process, such as oxidation and annealing. In addition, the breakdown voltage of the structure is lower for the shortage of spaces therebetween. Further, the re-growth of the tungsten silicide grain squeezes each other and causes the sidewall of the gate structure rough and uneven, and as a result, the local electric filed effect is enhanced and induces unpredicted discharge at sharp corners to damage the gate structure and shorten the lifetime of the flash memory. It is therefore desired a selfaligned process to obtain gate structure having a flat sidewall for flash memories.

SUMMARY OF THE INVENTION

An object of the present invention is to provide a self-aligned process to reach a smoothed sidewall of the gate for a flash memory.

Another object of the present invention is to provide a selfaligned process to enhance the voltage endurance of the gate structure for a flash memory.

In a selfaligned process for a flash memory, according to the present invention, a first polysilicon layer, ONO layer, second polysilicon layer, tungsten silicide layer and hard mask layer are deposited on a tunnel oxide layer and etched to form a gate structure. Then the sidewall of the tungsten silicide layer is cleaned by a solution having a high etch selectivity to tungsten silicide after the formation of source and drain with the gate structure as a mask and before annealing process. Spacer is further formed on the sidewall of the gate structure, and selfaligned contact window process is subsequently preceded.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
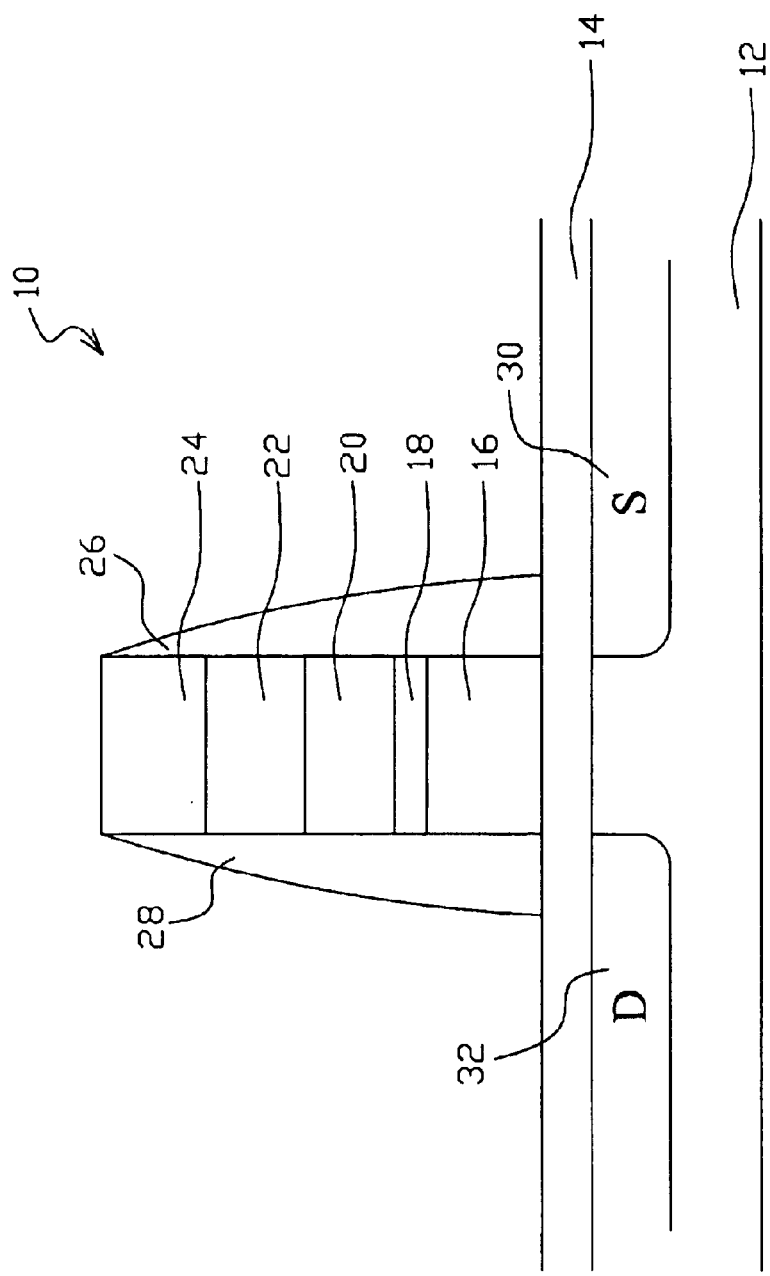
FIG. 1 is the cross-sectional view of the gate structure in a typical flash memory.
Figure 2:
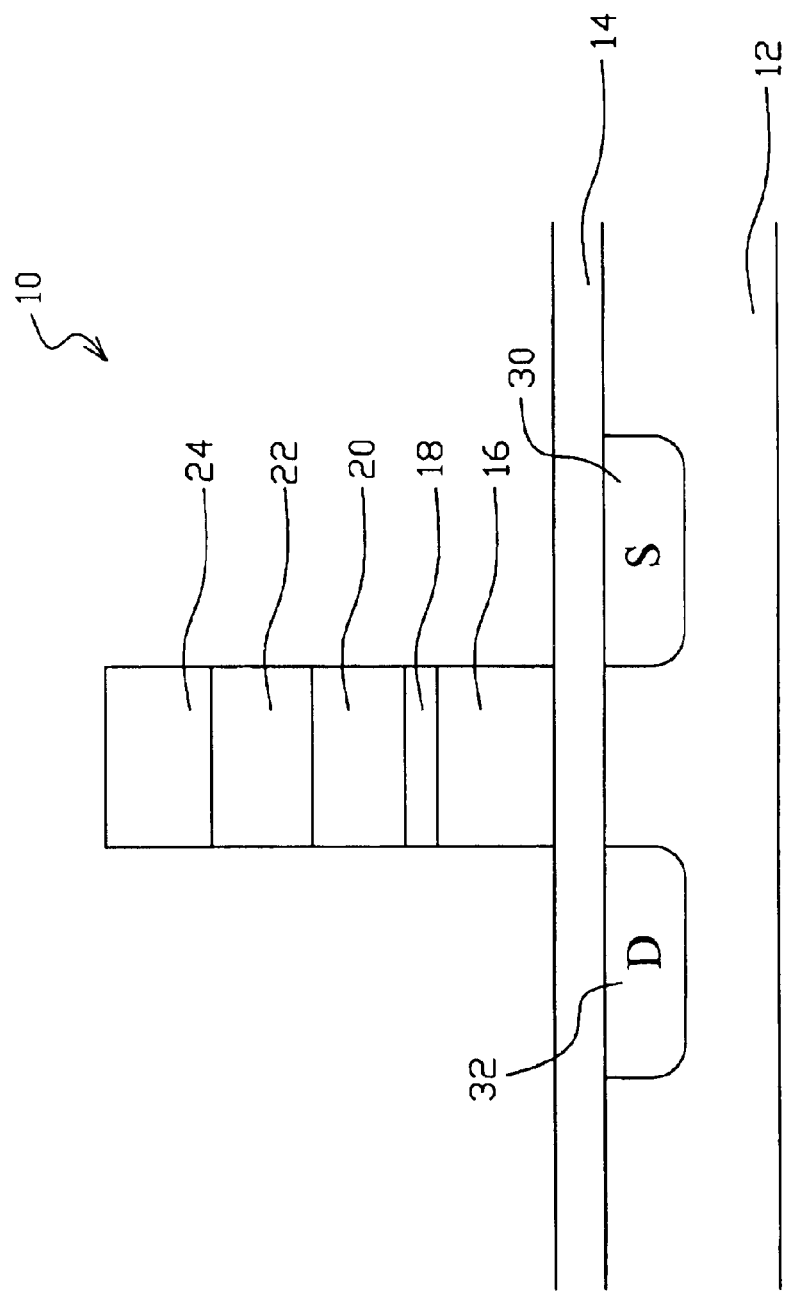
FIG. 2 is the cross-sectional view after forming a gate stack and source/drain.
Figure 3:
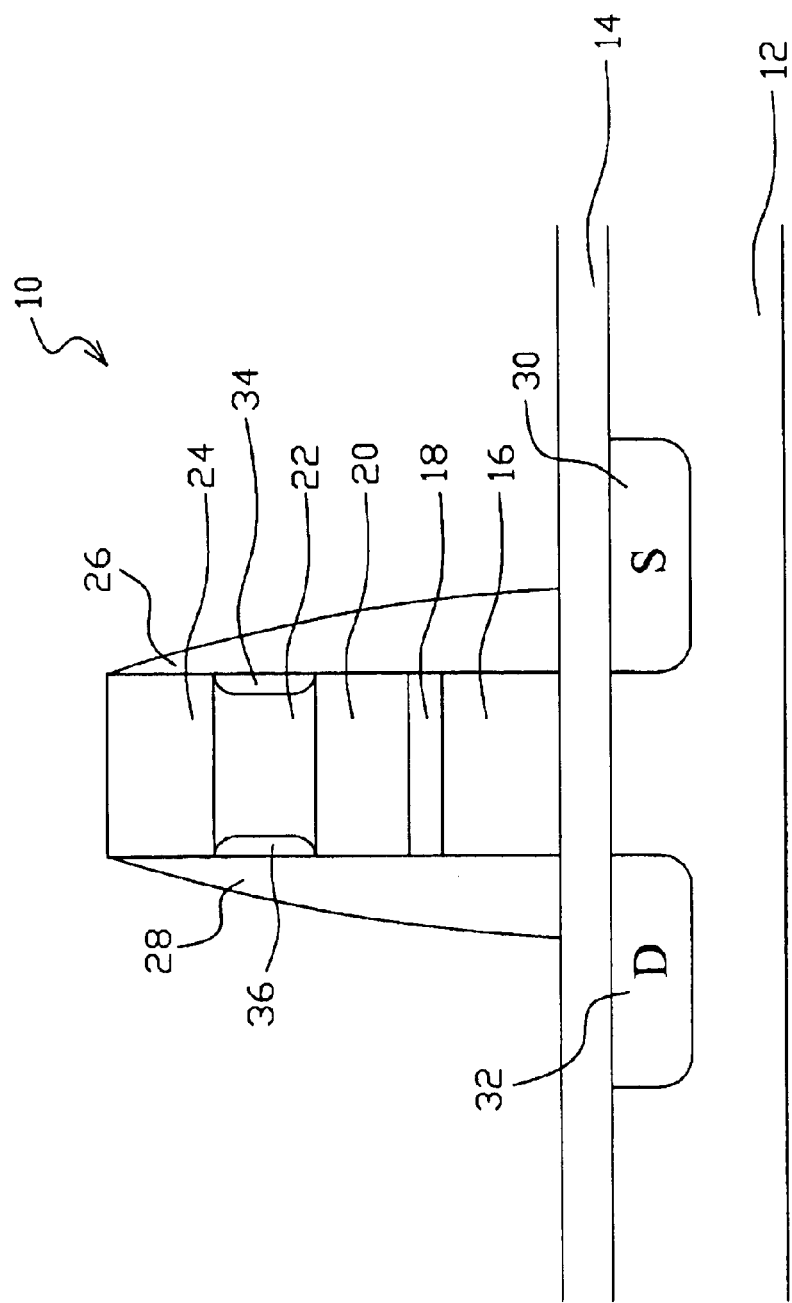
FIG. 3 is the cross sectional view after forming a spacer on the sidewall of the gate structure.

An embodiment according to the present invention to illustrate a selfaligned process for a flash memory is shown in FIG. 2 to FIG. 3. FIG. 2 is the cross-sectional view after a gate stack 10 and a source 30/drain 32 are formed, in which a tunnel oxide layer 14 is formed on a substrate 12 with a polysilicon layer 16 thereon, an ONO layer 18 is formed on the polysilicon layer 16 with another polysilicon layer 20 thereon, and a tungsten silicide layer 22 is formed on the second polysilicon layer 20 with a hard mask layer 24 thereon. After forming the gate stack 10, the source 30 and drain 32 are formed on the substrate 12 with the gate structure 10 as the mask in the first selfaligned process. Then a solution with a high etch selectivity to tungsten silicide is used to clean the sidewall of the tungsten silicide layer 22 in the gate structure 10. Preferably, SC-1 is used for the solution in this clean process. SC-1 is an alkaline peroxide solution that composes of five parts of deionized water, one part of 30% hydrogen peroxide, and one part of 29% ammonia. After this step, the sidewall of the tungsten silicide layer 22 is etched for the control of the critical dimension of the tungsten silicide layer 22. When the high etching selectivity solution is used to clean the sidewall of the tungsten silicide layer 22, the tungsten silicide layer 22 has a faster etching rate than other layers, and thus the sidewall of the tungsten silicide layer 22 is etched to form recess on its sidewall.

After the above clean process is finished, rapid thermal processing (RTP) is preceded in an atmosphere containing oxygen radical in a chamber so as to activate the gate, source and drain structures and form an oxide layer at the polysilicon 16 outskirt of the floating gate polysilicon 16 to prevent current leakage. Due to the thermal treatment using rapid thermal treatment in an atmosphere with oxygen radical, surface reaction is the main reaction mechanism of the thermal oxidation in this atmosphere and thus the tungsten silicide layer 22 is kept smooth on its surface and not easy to expand. When using the rapid thermal process in an atmosphere with oxygen free radical, hydrogen and oxygen are additionally pumped into the chamber at a low pressure from about 5 torrs to 50 torrs.

After the above annealing process, the crystal structure of the tungsten silicide layer 22 is transferred from tetragon cubic crystal to hexagon cubic crystal. SiN or SiO2 is deposited and etched to form spacers 26 and 28 on the sidewalls of the gate structure 10, as shown in FIG. 3. Since the tungsten silicide layer 22 is previously cleaned with a high etch selectivity solution, gaps 34 and 36 are formed between the tungsten silicide layer 22 and spacers 26 and 29 from the recesses, and thereby increasing the distance between the tungsten silicide layer 22 and spacers 26 and 28. When the tungsten silicide layer 22 expands due to the thermal stress in the subsequent thermal process, no squeezing is happened to damage the gate structure 10. As a result, the surface of the tungsten silicide layer 22 and gate structure 10 is kept smooth, and the distances between the tungsten silicide layer 22 and contact windows will not be shortened. Poor performance such as increasing in local electric field and decreasing in breakage voltage won't happen.

Figure 4:
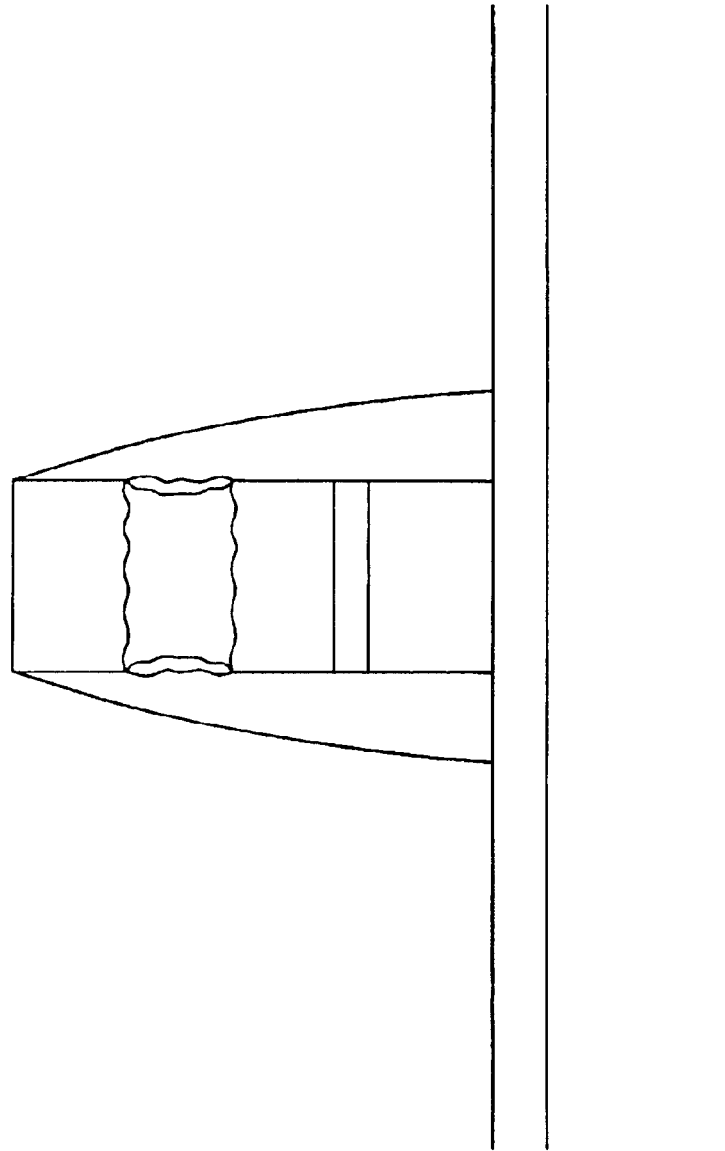
FIG. 4 is an illustration of a conventional gate structure after deformation caused by thermal expansion of the tungsten silicide in the gate structure.

FIG. 4 is an illustration of the deformation of a conventional gate structure due to the thermal expansion of the tungsten silicide for comparison with the resultant structure formed by the inventive process. In a conventional self-aligned process, the tungsten silicide layer in a gate structure will expand due to thermal stress in any subsequent thermal process. Since there is no excess space in the gate structure for the expanded volume of the tungsten silicide layer caused by thermal stress, the grains inside the tungsten silicide layer will push each other and increases the critical dimension of the tungsten silicide layer, and the breakage voltage between the tungsten silicide layer and contact windows will be lowered. In contrast, the inventive self-aligned process generates a buffer gaps 34 and 36 between the tungsten silicide layer 22 and spacers 26 and 28. When the tungsten silicide layer 22 expands due to thermal stress, gaps 34 and 36 buffer the expansion of the tungsten silicide layer 22 and thereby do not affect the structure inside the tungsten silicide layer 22.

Figure 5:
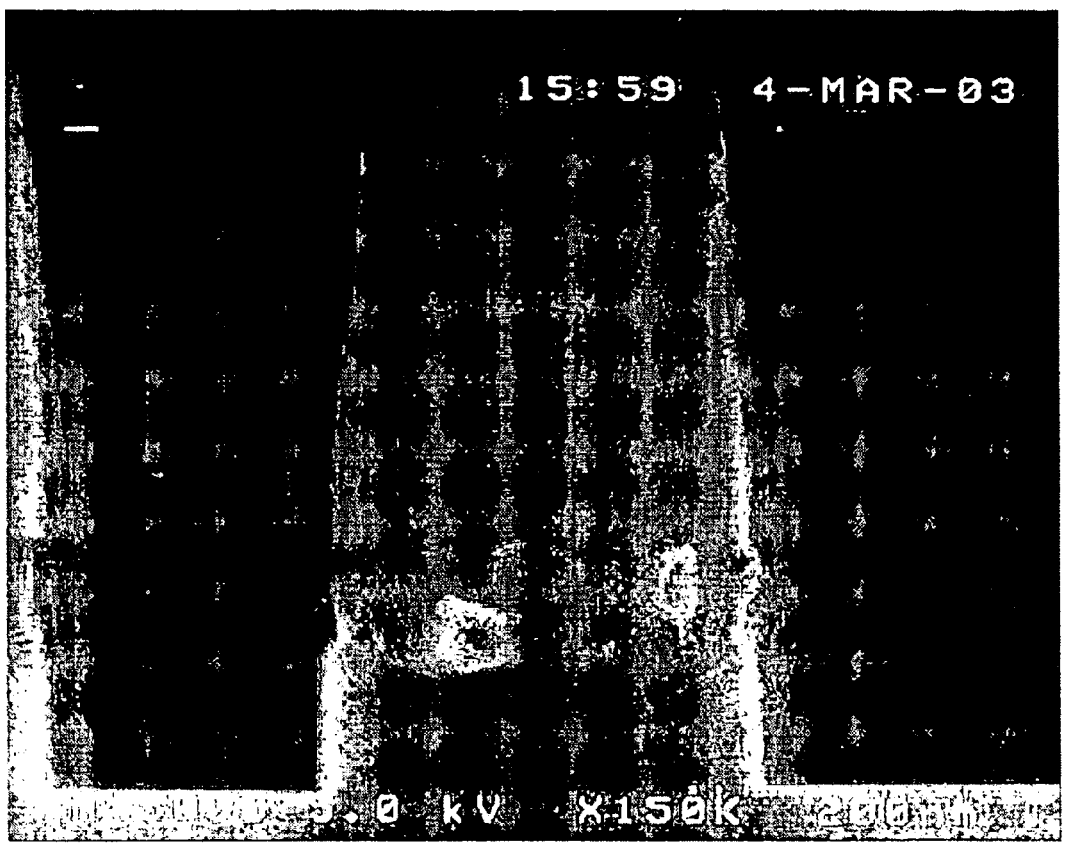
FIG. 5 is a microscope photograph of a conventional gate structure.
Figure 6:
FIG. 6 is a microscope photograph of the gate structure produced by the inventive process.

FIG. 5 is a microscope photograph of a conventional gate structure. The squeezing of the tungsten silicide layer due to the thermal expansion caused by thermal stress can be seen thereof, and the surface of the sidewall is very rough. FIG. 6 is a microscope photograph of the gate structure produced by the inventive process, in which the tungsten silicide layer is not squeezed due to the expansion caused by thermal stress, and the surface of the sidewall is very smooth. Comparing FIGS. 5 and 6, the selfaligned process proposed in the present invention has obviously improved the disadvantages of the prior gate structure.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A self-aligned process for a flash memory, comprising the steps of:

depositing a first polysilicon layer, an ONO layer, a second polysilicon layer, a tungsten silicide, and a hard mask layer in a stack over a tunnel oxide layer for a gate structure having a sidewall;

forming a drain and source regions with said gate structure as a mask;

cleaning said tungsten silicide layer with a solution having a high etch selectivity to said tungsten silicide;

performing an annealing process comprising hydrogen and oxygen gases; and forming a spacer on said sidewall such that buffer gaps are formed in said sidewall between said etched tungsten silicide and said spacer, whereby thermal expansion stress is reduced.

2. The self-aligned process according to claim 1, wherein said step of cleaning said tungsten silicide layer comprises applying an SC-1 solution to said tungsten silicide layer.

3. The self-aligned process according to claim 1, wherein said step of performing an annealing process comprises applying a rapid thermal treatment.

4. A self-aligned process for a flash memory, comprising the steps of:

forming a gate stack including a metal silicide on a tunnel oxide layer;

forming drain and source regions with said gate stack as a mask;

etching a sidewall of said metal silicide;

performing an annealing process comprising hydrogen and oxygen gases; and forming a spacer for said gate stack such that buffer gaps are formed between said etched sidewall of said metal silicide and said spacer, whereby thermal expansion stress is reduced;

wherein said step of etching a sidewall of said metal silicide comprises applying a solution having a high etch selectivity to said metal silicide.

5. The self-aligned process according to claim 4, wherein said step of performing an annealing process comprises applying a rapid thermal treatment.

6. The self-aligned process according to claim 5, wherein said step of applying the rapid thermal treatment comprises heating in an atmosphere containing oxygen free radicals in a chamber.

7. The self-aligned process according to claim 6, wherein said chamber has a pressure of about 5 to 50 torr.

* * * * *